United States Patent
Huang

(10) Patent No.: US 7,847,380 B2
(45) Date of Patent: Dec. 7, 2010

(54) TAPE SUBSTRATE AND SEMICONDUCTOR MODULE FOR SMART CARD, METHOD OF FABRICATING THE SAME, AND SMART CARD

(75) Inventor: Yucai Huang, Jiangsu (CN)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 248 days.

(21) Appl. No.: 12/212,575

(22) Filed: Sep. 17, 2008

(65) Prior Publication Data
US 2009/0079053 A1   Mar. 26, 2009

(30) Foreign Application Priority Data
Sep. 20, 2007 (CN) .................. 2007 1 0151914
Jul. 25, 2008 (KR) .................. 10-2008-0073046

(51) Int. Cl.
*H01L 23/02* (2006.01)
(52) U.S. Cl. ............... 257/678; 257/679; 257/685; 257/E23.034; 257/E23.055; 439/607.22
(58) Field of Classification Search ........... 257/679, 257/922, 678, 777, E23.034, E23.055; 235/380; 361/666–796, E23.001–E23.194; 439/607.22, 439/946
See application file for complete search history.

(56) References Cited

U.S. PATENT DOCUMENTS

| 6,235,555 | B1 * | 5/2001 | Cho ............................ 438/112 |
| 6,472,733 | B1 * | 10/2002 | Le Loc'h ..................... 257/679 |
| 6,513,718 | B1 * | 2/2003 | Bouchez et al. ............. 235/492 |
| 6,709,889 | B2 * | 3/2004 | Gore et al. .................. 438/106 |

FOREIGN PATENT DOCUMENTS

| JP | 2004-266109 | * | 9/2004 |
| JP | 2006-179512 | * | 6/2006 |
| KR | 10-0651796 | * | 11/2006 |

* cited by examiner

*Primary Examiner*—Jasmine J Clark
(74) *Attorney, Agent, or Firm*—Muir Patent Consulting, PLLC

(57) ABSTRACT

Provided are a tape substrate for a smart card, a method of fabricating the same, and a semiconductor module and a smart card using the tape substrate. The tape substrate includes at least one tape unit. The at least one tape unit includes a chip mounting unit defining a region on which a semiconductor chip is to be mounted, a plurality of pin electrode units arranged around the chip mounting unit and separated from one another, a border unit encircling the chip mounting unit and the pin electrode units, and a cutting unit disposed between the chip mounting unit and the border unit and between the pin electrode units and the border unit. The cutting unit includes a plurality of connection lines connecting the chip mounting unit and the pin electrode units to the border unit.

21 Claims, 7 Drawing Sheets

(a)

(b)

(c)

(d)

TAPE SUBSTRATE AND SEMICONDUCTOR MODULE FOR SMART CARD, METHOD OF FABRICATING THE SAME, AND SMART CARD

CROSS-REFERENCE TO RELATED APPLICATIONS

This application claims priority under 35 U.S.C §119 to Chinese Patent Application No. 200710151914.8, filed on Sep. 20, 2007, in the State Intellectual Property Office of the People's Republic of China and Korean Patent Application No. 10-2008-0073046, filed on Jul. 25, 2008 in the Korean Intellectual Property Office, the disclosures of which are incorporated herein in their entirety by reference.

BACKGROUND

The inventive concept relates to a semiconductor device, and more particularly, to a smart card, a tape substrate and semiconductor module for the smart card, and a method of fabricating the same.

Recently, the use of smart cards that enable data to be stored in a secret fashion and that are easy to carry has become popular. In general, an organic tape substrate is used for assembly of such a smart card. However, the organic tape substrate is complicated and costly to manufacture because deposition of copper foil and etching are needed. The manufacturing cost of the organic tape takes up more than 50% of the total costs incurred for the assembly of a smart card. Accordingly, there is a need to develop a tape substrate for a smart card, which is appropriate for the assembly of a smart card and which can reduce the overall manufacturing costs of the smart card.

SUMMARY

According to an aspect of the inventive concept, there is provided a tape substrate for a smart card, the tape substrate including at least one tape unit. The at least one tape unit includes a chip mounting unit defining a region on which a semiconductor chip is to be mounted, a plurality of pin electrode units arranged around the chip mounting unit and being separated from one another, a border unit encircling the chip mounting unit and the pin electrode units, and a cutting unit disposed between the chip mounting unit and the border unit and between the pin electrode units and the border unit. The cutting unit includes a plurality of connection lines connecting the chip mounting unit and the pin electrode units to the border unit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
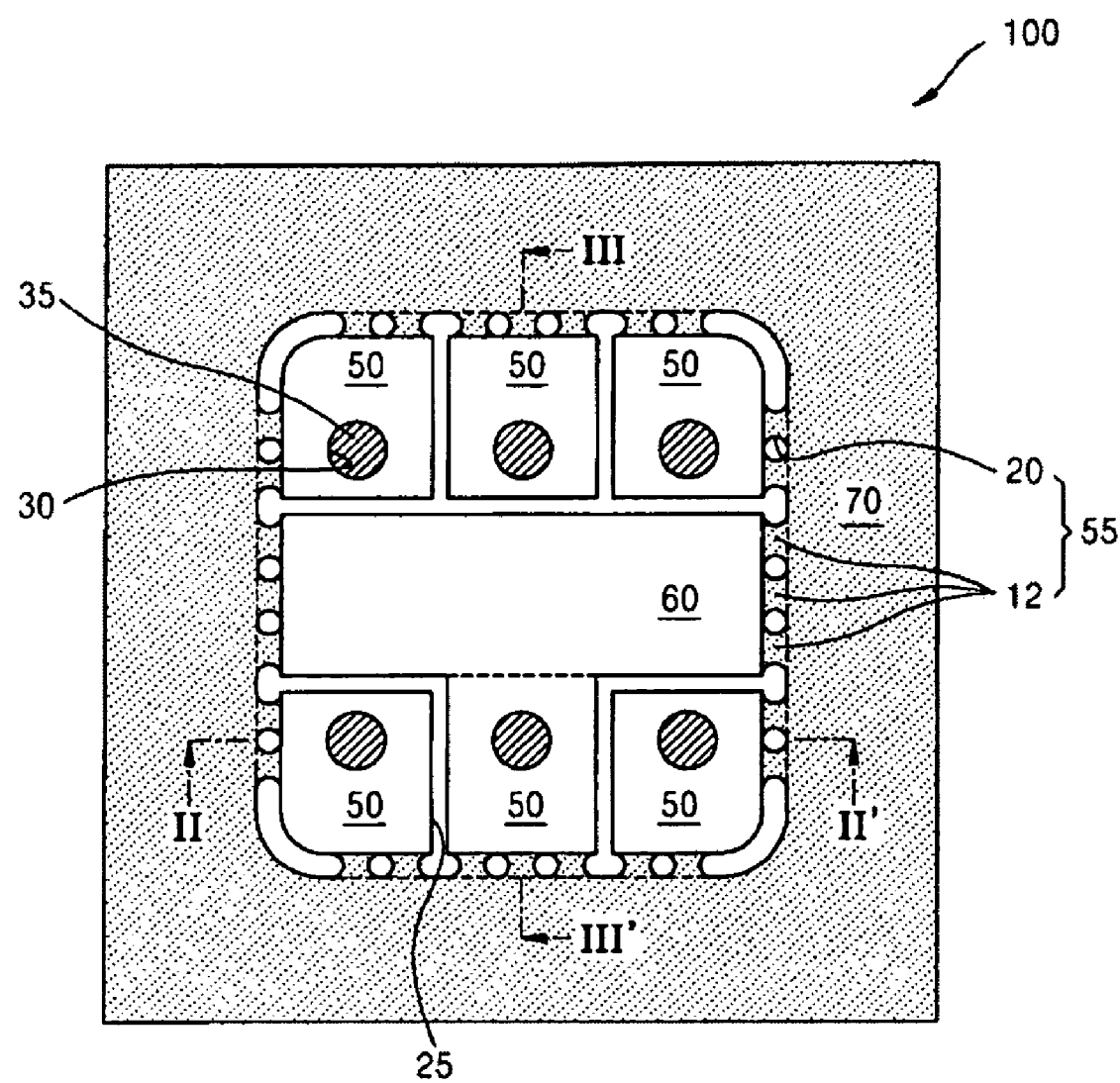
FIG. 1 is a plan view of a tape unit according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein. Rather, these embodiments are provided so that this disclosure will be thorough and complete and will fully convey the inventive concept to those skilled in the art. In the drawings, the thickness of layers and regions may be exaggerated for clarity.

Figure 2:
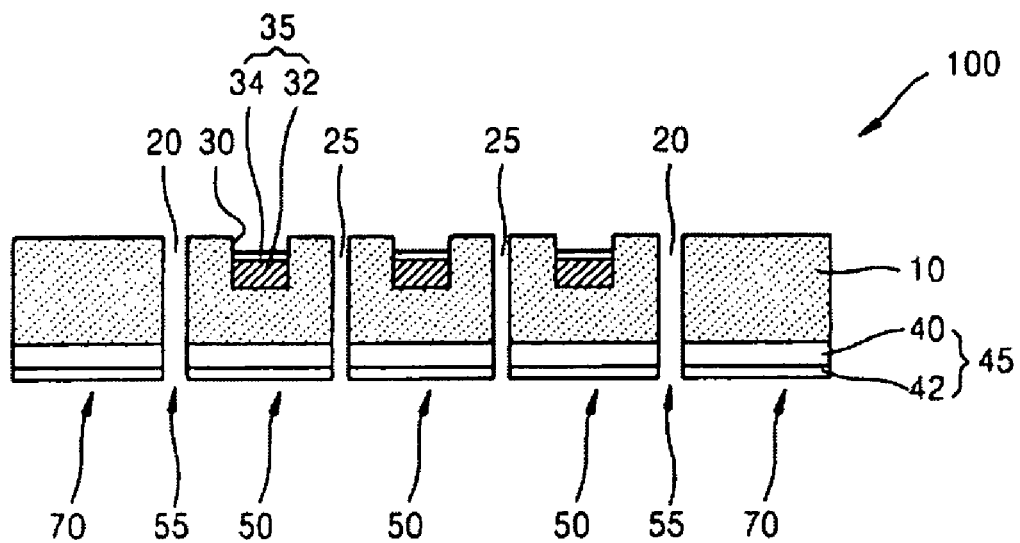
FIG. 2 is a cross-sectional view taken along the line II-II' of FIG. 1.
Figure 3:
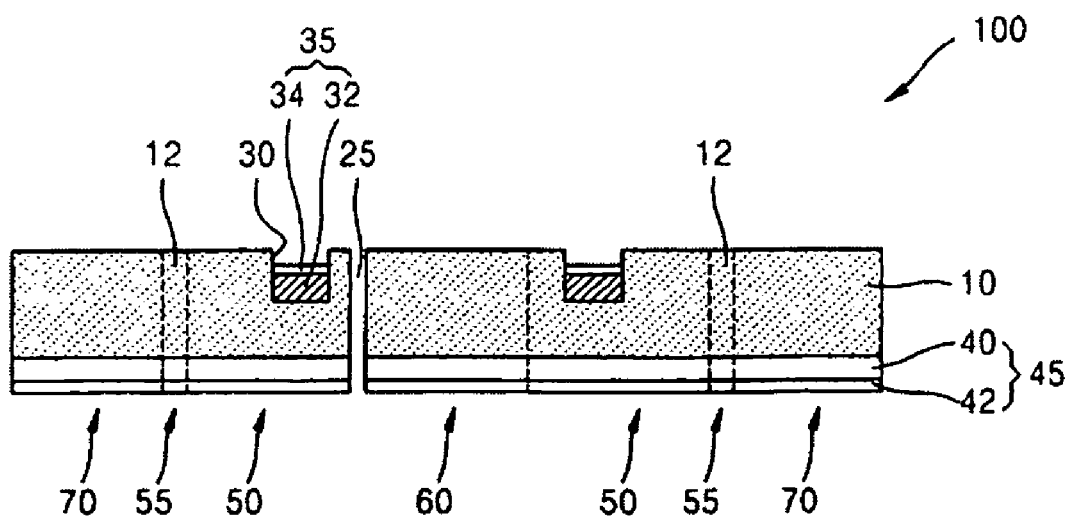
FIG. 3 is a cross-sectional view taken along the line III-III' of FIG. 1.

FIG. 1 is a plan view of a tape unit 100 according to an embodiment of the inventive concept. FIG. 2 is a cross-sectional view taken along the line II-II' of FIG. 1. FIG. 3 is a cross-sectional view taken along the line III-III' of FIG. 1.

Referring to FIGS. 1 through 3, a tape unit 100 includes a chip mounting unit 60, which is a region upon which a semiconductor chip (not shown) is to be mounted. A plurality of pin electrode units 50 may be arranged around the chip mounting unit 60. A border unit 70 may encircle the chip mounting unit 60 and the pin electrode units 50. A cutting unit 55 may be provided between the chip mounting unit 60 and the border unit 70, and between the pin electrode units 50 and the border unit 70.

At least one side of the chip mounting unit 60 may be coupled to the border unit 70 via the cutting unit 55. For example, the cutting unit 55 may include a plurality of connection lines 12 and the chip mounting unit 60 may be coupled to the border line 70 via the connection lines 12. For example, the connection lines 12 may be disposed between stamping holes 20.

The pin electrode units 50 may be separated from one another via trenches 25. However, the pin electrode units 50 may be coupled to the border unit 70 via the cutting unit 55 so that the pin electrode units 50 are not separated from the tape unit 100. For example, the pin electrode units 50 and the border unit 70 may be connected via the connection lines 12. Alternatively, one of the pin electrode units 50 may be directly coupled to the chip mounting unit 60 and the other pin electrode units 50 may be separated from one another via the chip mounting unit 60 and the trenches 25. In this case, the pin electrode units 50 are not directly connected to one another but instead can be connected via the border unit 70.

As described above, the cutting unit 55 is disposed so as to encircle the outer borders of the chip mounting unit 60 and pin electrode units 50 and thus can mechanically fix the chip mounting unit 60 and the pin electrode units 50 with respect to the border unit 70. Accordingly, the connection lines 12 may be disposed between the chip mounting unit 60 and the border unit 70 and between each of the pin electrode units 50 and the border unit 70.

The tape unit 100 may be formed of a metal material. For example, the pin electrode units 50, the cutting unit 55, the chip mounting unit 60 and the border unit 70 may include a metal substrate 10. For example, the metal substrate 10 may contain copper (Cu) or a copper alloy (Cu alloy) but the present embodiment is not limited thereto.

Each of the pin electrode units 50 may include a groove 30 on a front side thereof, and include a bonding pad layer 35 in the groove 30. Further, each of the pin electrode units 50 may include a contact layer 45 on a back side of the metal substrate 10. In addition to the pin electrode units 50, the cutting unit 55, the chip mounting unit 60 and the border unit 70 may include the contact layer 45 on the back side of the metal substrate 10.

For example, the bonding pad layer 35 may include a first seed layer 32 on the front side of the metal substrate 10, and a first finish layer 34 on the first seed layer 32. The contact layer 45 may include a second seed layer 40 on the back side of the metal substrate 10, and a second finish layer 42 on the second seed layer 40. The first and second seed layers 32 and 40 may include nickel and the first and second finish layers 34 and 42 may include gold. However, the materials of the bonding pad layer 35 and the contact layer 45 are just illustrative and thus, the present embodiment is not limited thereto.

The tape unit 100 is formed of a metal material and thus can be manufactured at lower cost than conventional units in which copper foil is deposited on an organic material.

Figure 4:
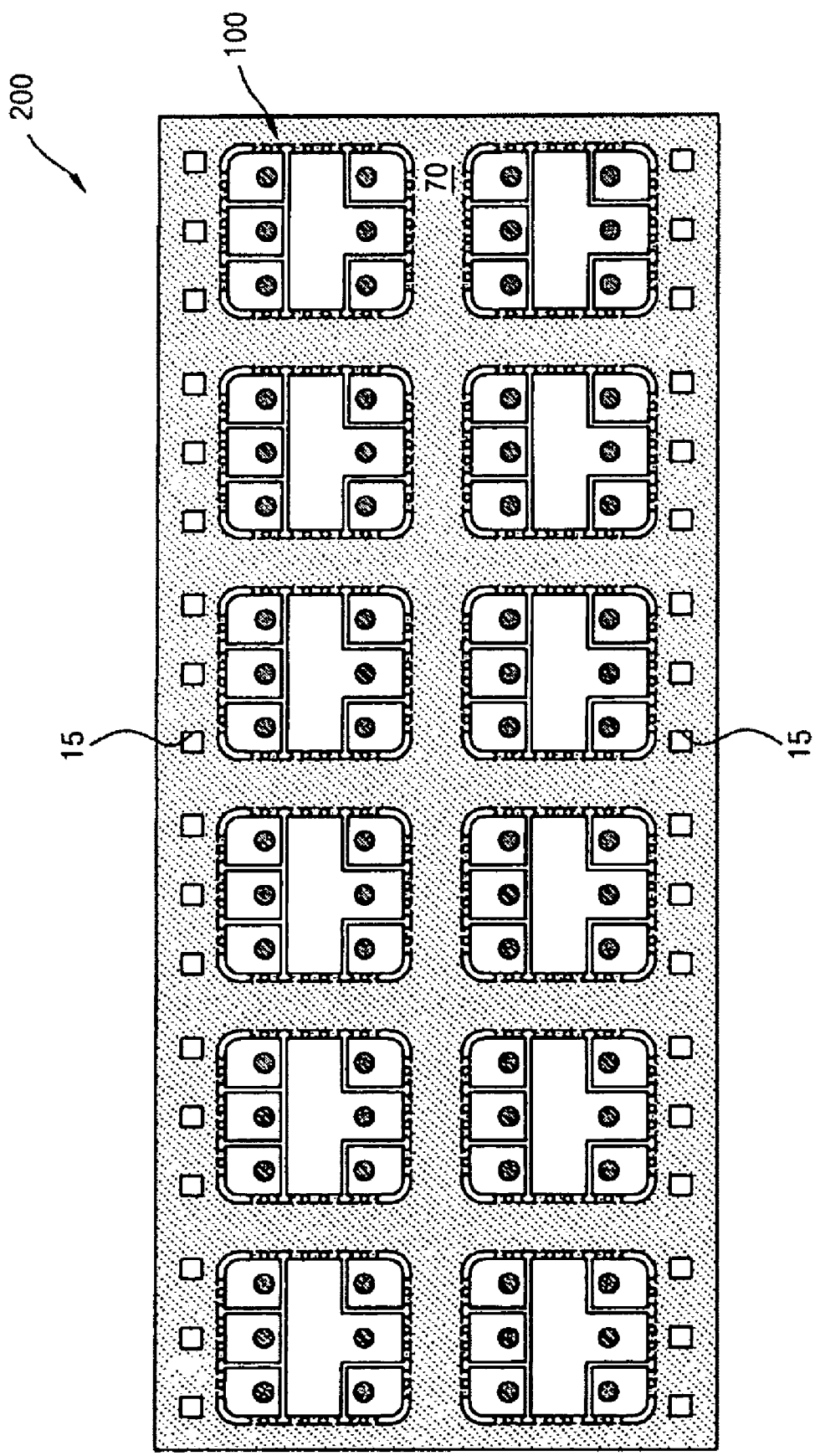
FIG. 4 is a plan view of a tape substrate according to an embodiment of the inventive concept.

FIG. 4 is a plan view of a tape substrate 200 according to an embodiment of the inventive concept. Referring to FIG. 4, the tape substrate 200 may include at least one tape unit 100, and preferably a plurality of tape units 100. The tape units 100 are as described above with reference to FIGS. 1 through 3. The plurality of tape units 100 may be arranged in a matrix in the tape substrate 200.

The tape units 100 may be connected via the border unit 70 of FIG. 1 and the tape substrate 200 may be manufactured in the form of a reel. A plurality of location holes 15 may be used as alignment marks for accessing the tape units 100.

Figure 5:
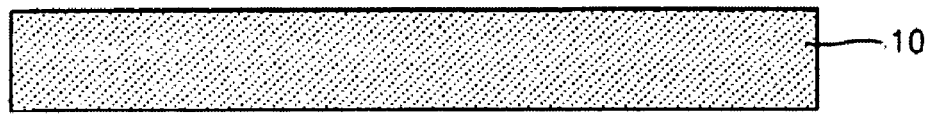
FIG. 5 illustrates a method of fabricating a tape substrate according to an embodiment of the inventive concept.
Figure 5:
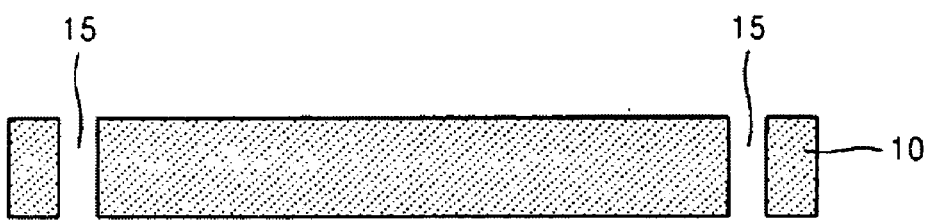
Figure 5:
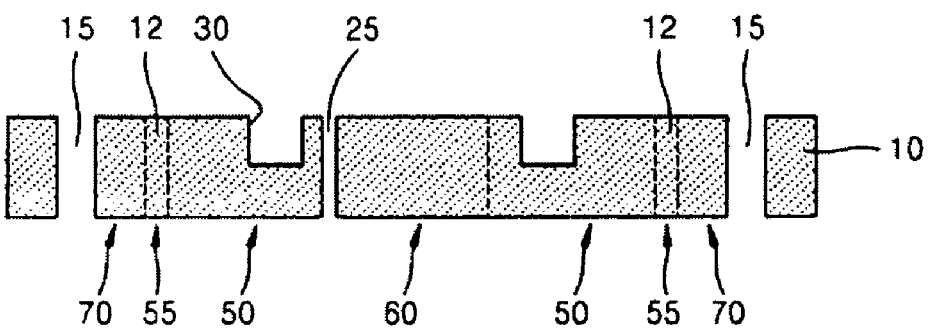
Figure 5:
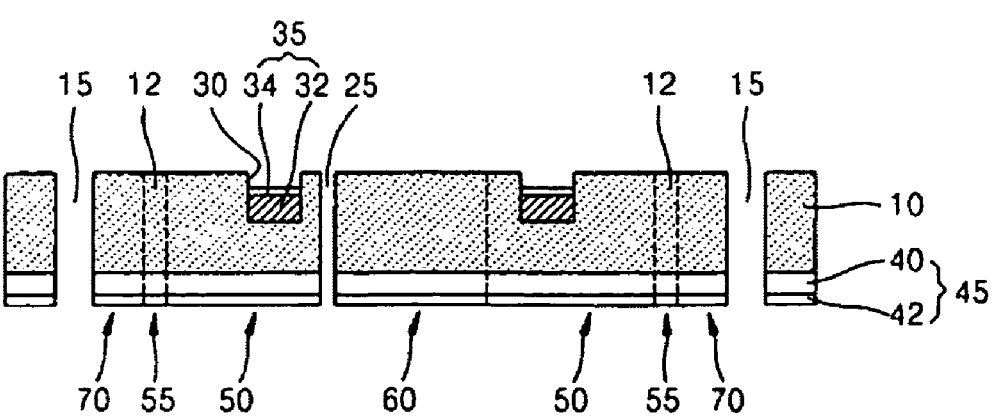

FIG. 5 is a cross-sectional view illustrating a method of fabricating a tape substrate according to an embodiment of the inventive concept. First, a metal substrate 10 may be prepared as illustrated in (a) of FIG. 5. Next, as illustrated in (b) of FIG. 5, at least one location hole 15 may be formed by removing a part of the metal substrate 10. For example, the location hole 15 may be formed using punching. As another example, the location hole 15 may be formed through photolithography and etching.

Next, as illustrated in (c) of FIG. 5, a chip mounting unit 60 and a plurality of pin electrode units 50 may be defined by removing portions of the metal substrate 10. For example, the pin electrode units 50 may be separated from one another by forming a plurality of trenches 25 in the metal substrate 10 using photolithography and etching with reference to the location hole 15. A cutting unit 55 and a border unit 70 may further be defined by forming a plurality of stamping holes 20 before, after, or simultaneous with the forming of the trenches 25. Therefore, the pin electrode units 50 and the chip mounting unit 60 can be mechanically fixed with respect to the border unit 70 via connection lines 12.

Next, a plurality of grooves 30 may be formed on the metal substrate 10 of the pin electrode units 50. For example, the grooves 30 may be formed through partial etching.

Thereafter, as illustrated in (d) of FIG. 5, a bonding pad layer 35 may be formed within the grooves 30, and a contact layer 45 may be formed on a back side of the metal substrate 10. For example, the bonding pad layer 35 may be obtained by forming a first seed layer 32 in the groves 30 and a first finish layer 34 on the first seed layer 32. The contact layer 45 may be obtained by forming a second seed layer 40 on the back side of the metal substrate 10, and a second finish layer 42 on the second seed layer 40. The first and second seed layers 32 and 40 and the first and second finish layers 34 and 42 may be manufactured through electroplating and/or physical deposition techniques.

As described above, the bonding pad layer 35 and the contact layer 45 may be formed of the same metal, i.e., a stacked structure of nickel/gold, and may be manufactured at the same time or according to a specific order.

Figure 6:
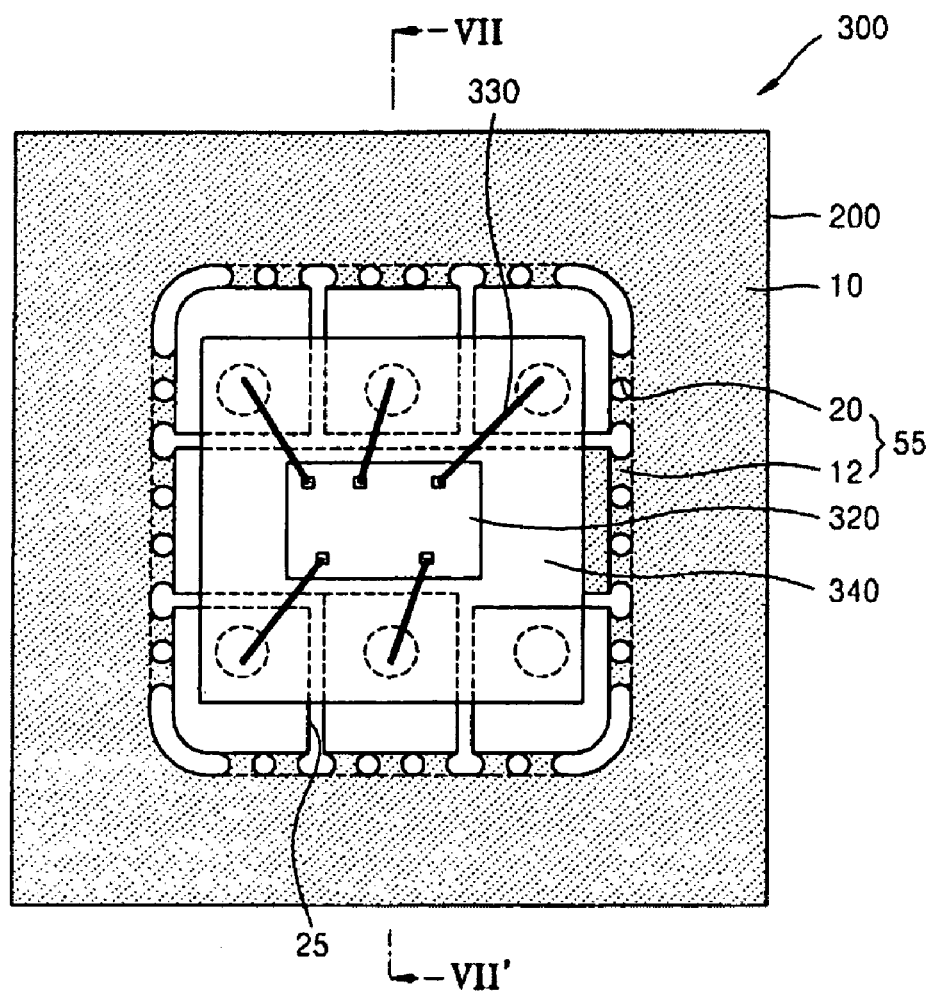
FIG. 6 is plan view of a semiconductor module according to an embodiment of the inventive concept.
Figure 7:
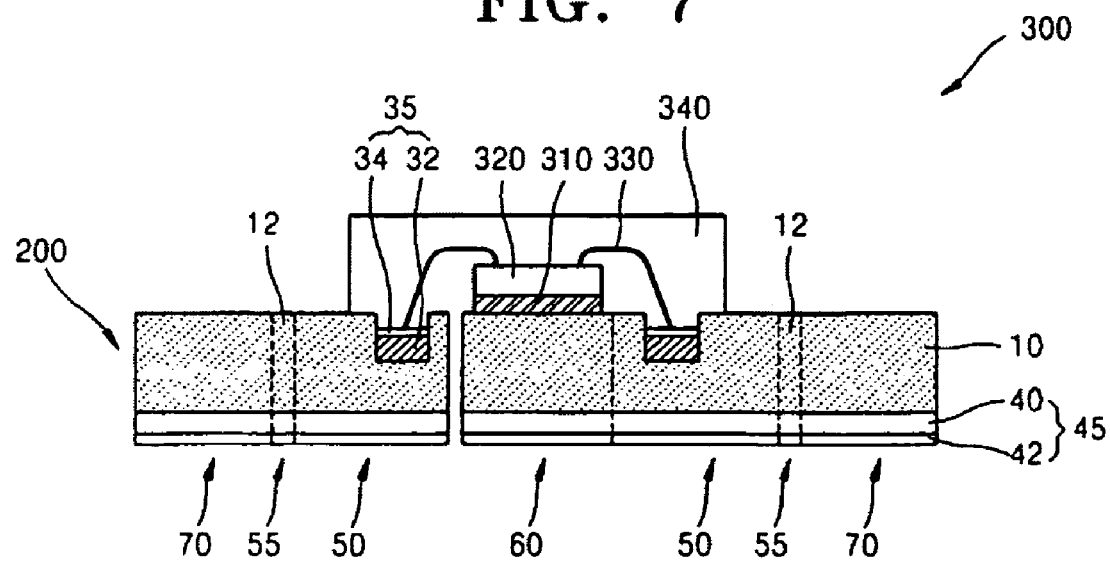
FIG. 7 is a cross-sectional view taken along the line VII-VII' of FIG. 6.

FIG. 6 is a plan view of a semiconductor module 300 for a smart card according to an embodiment of the inventive concept. FIG. 7 is a cross-sectional view taken along the line VII-VII' of FIG. 6.

Referring to FIGS. 6 and 7, a tape substrate 200 is as described above with reference to FIGS. 1 through 4. A semiconductor chip 320 may be mounted on a chip mounting unit 60 via an adhesive unit 310. A plurality of bonding wires 330 may electrically connect the tape substrate 200 and the semiconductor chip 320. For example, the ends of each of the bonding wires 330 may be respectively bonded with the bonding pad layer 35 and the semiconductor chip 320.

A molding unit 340 may be provided on the tape substrate 200 so as to cover the semiconductor chip 320 and the bonding wires 330. For example, the molding unit 340 may include an epoxy molding compound for good mechanical performance and stable, dynamic support.

Figure 8:
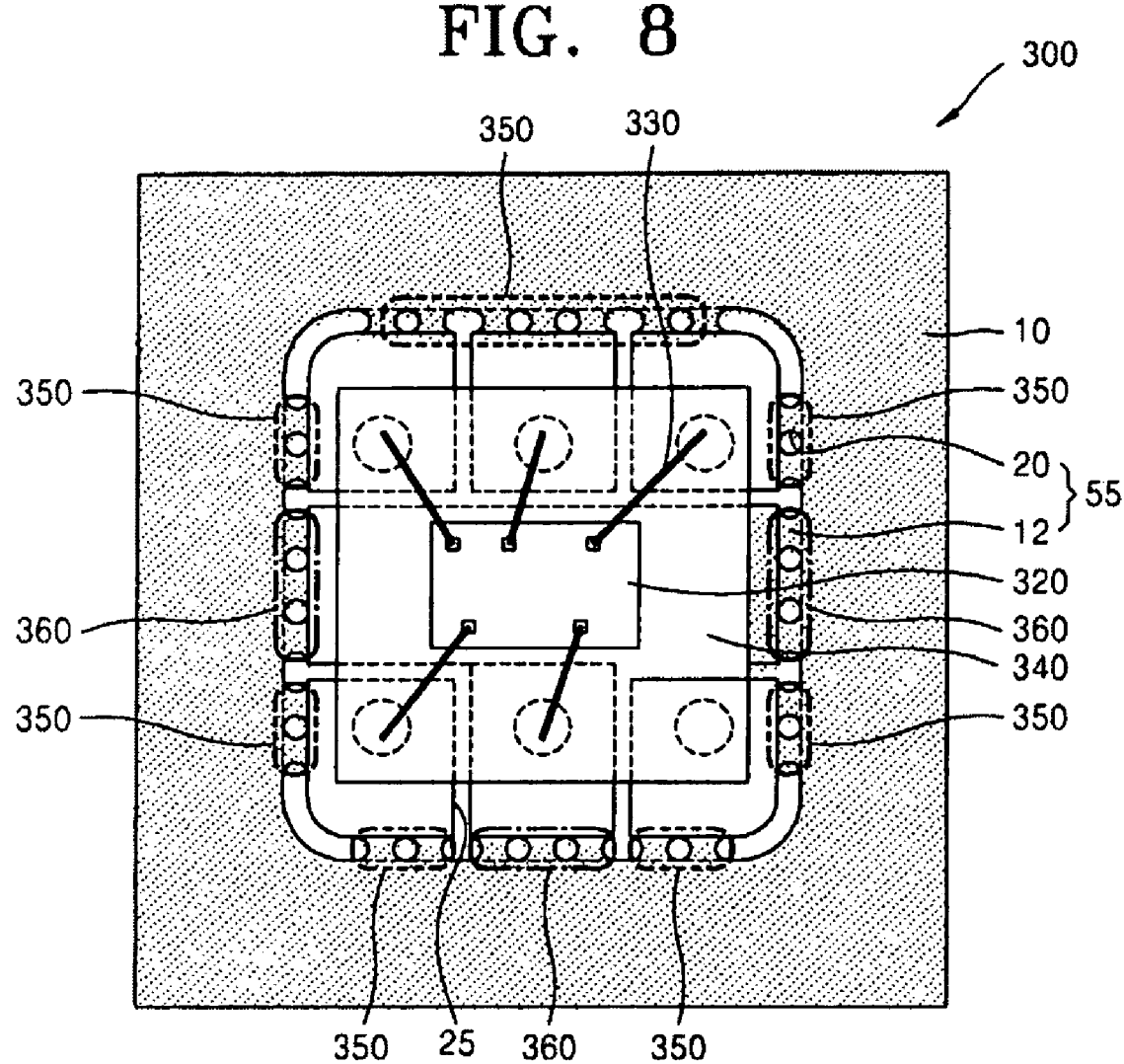
FIG. 8 is a plan view illustrating a punching operation for testing the functionality of the semiconductor module of FIG. 6, according to an embodiment of the inventive concept.

FIG. 8 is a plan view illustrating a punching operation for testing the functionality of the semiconductor module 300 of FIG. 6 according to an embodiment of the inventive concept. Referring to FIG. 8, the pin electrode units 50 are electrically disconnected in order to test the functionality of the semiconductor module 300. For example, the pin electrode units 50 can be electrically disconnected by cutting connection lines 12 in first regions 350. Further, the connection lines 12 in the first regions 350 may be easily cut by punching.

Connection lines 12 may remain in second regions 360 at three locations. For example, the connection lines 12 in the second regions 360 may include the connection lines 12 connected to a chip mounting unit 60, and the connection lines 12 connected to pin electrode units coupled to the chip mounting unit 60.

Accordingly, the pin electrode units 50 can be electrically disconnected from one another, and thus, the semiconductor module 300 can be electrically tested. Further, the semiconductor module 300 can be mechanically fixed with respect to the border unit 70 via the connection lines 12 in the second regions 360. The connection lines 12 in the second region 360 may be cut when assembling the semiconductor module 300 with a smart card.

Figure 9:
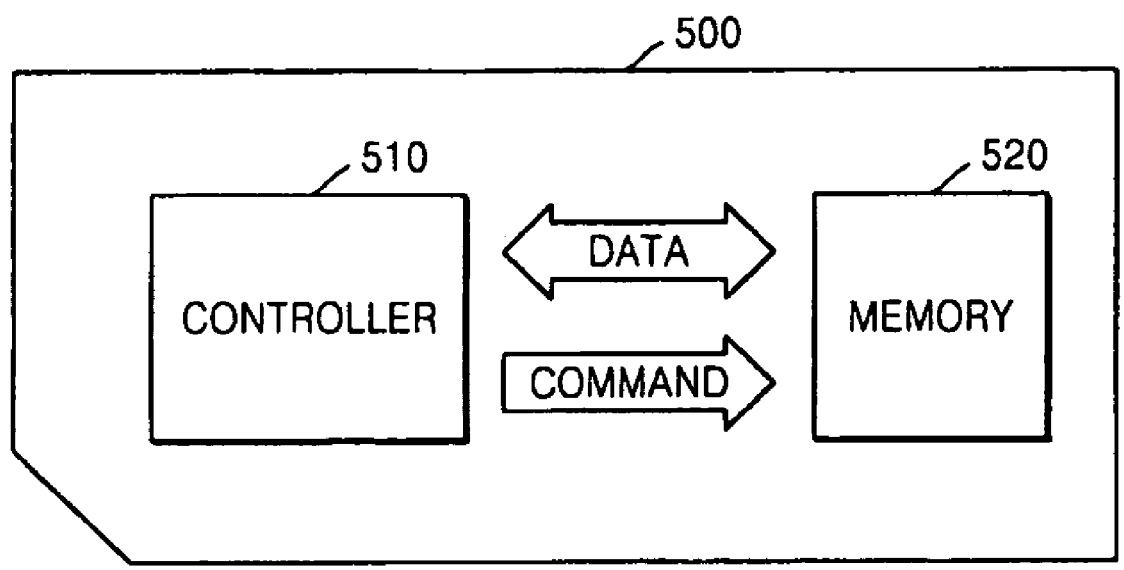
FIG. 9 is a block diagram schematically illustrating a smart card according to an embodiment of the inventive concept.

FIG. 9 is a block diagram schematically illustrating a smart card 500 according to an embodiment of the inventive concept. Referring to FIG. 9, a controller 510 and a memory 520 may be arranged to exchange electrical signals with each other. For example, the memory 520 and the controller 510 may exchange data with each other in response to a command given from the controller 510. The smart card 500 can store data in the memory 520 or output data received from the memory 520 to an external device by communicating with the external device in a contact manner or a non-contact manner. For example, the memory 520 may be embodied as the semiconductor module 300 illustrated in FIG. 6.

The smart card 500 may be used as a memory card for storing data or as a credit card which information is input to or output from. For example, the memory card may be a multimedia card (MMC) or a secure digital (SD) card.

According to an aspect of the inventive concept, there is provided a tape substrate for a smart card, the tape substrate including at least one tape unit. The at least one tape unit includes a chip mounting unit defining a region on which a semiconductor chip is to be mounted, a plurality of pin electrode units arranged around the chip mounting unit and being separated from one another, a border unit encircling the chip mounting unit and the pin electrode units, and a cutting unit being disposed between the chip mounting unit and the border unit and between the pin electrode units and the border unit. The cutting unit includes a plurality of connection lines connecting the chip mounting unit and the pin electrode units to the border unit.

The cutting unit may include a plurality of stamping holes defining the connection lines. The chip mounting unit may be connected to one of the pin electrode units. The chip mounting unit, the pin electrode units, the border unit and the cutting unit may include a metal substrate. Each of the pin electrode units may include a groove formed at a front side of the metal substrate, and a bonding pad layer in the groove. The at least one tape unit may include a plurality of tape units, and the plurality of the tape units may be connected in the form of a reel.

According to another aspect of the inventive concept, there is provided a semiconductor module for a smart card, wherein a tape substrate is prepared as described above, a semiconductor chip is mounted on the tape substrate, and a plurality of wires connect the semiconductor chip to the tape substrate. Each of the pin electrode units may further include a groove in a front side of a metal substrate, and a bonding pad layer in the groove. Each of the wires may be connected to the bonding pad layer.

According to another aspect of the inventive concept, there is provided a method of fabricating a tape substrate for a smart card, the method including forming at least one location hole in a metal substrate, defining a chip mounting unit and a plurality of pin electrode units by removing a part of the metal substrate with respect to the at least one location hole, forming a groove in the metal substrate of each of the pin electrode units, forming a bonding pad layer in each of the grooves, and forming a contact layer at a back side of the metal substrate. The groove may be formed through half-etching.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A tape substrate for a smart card, the tape substrate comprising:
at least one tape unit, wherein the at least one tape unit comprises:
a chip mounting unit defining a region on which a semiconductor chip is to be mounted;
a plurality of pin electrode units disposed adjacent to a portion of the chip mounting unit;
a border unit disposed around the chip mounting unit and the pin electrode units; and
a cutting unit disposed between the chip mounting unit and the border unit and between the pin electrode units and the border unit,
wherein the cutting unit comprises a plurality of connection lines connecting the chip mounting unit and the pin electrode units to the border unit.

2. The tape substrate of claim 1, wherein the cutting unit comprises a plurality of stamping holes defining the connection lines.

3. The tape substrate of claim 1, wherein the chip mounting unit is connected to at least one of the pin electrode units.

4. The tape substrate of claim 1, wherein the chip mounting unit, the pin electrode units, the border unit and the cutting unit comprise a metal substrate.

5. The tape substrate of claim 4, wherein each of the pin electrode units comprises:
a groove formed at a front side of the metal substrate; and
a bonding pad layer disposed in the groove.

6. The tape substrate of claim 5, wherein the bonding pad layer comprises a first seed layer on the metal substrate and a first finish layer on the first seed layer.

7. The tape substrate of claim 6, wherein the first seed layer comprises nickel and the first finish layer comprises gold.

8. The tape substrate of claim 5, wherein the chip mounting unit, the pin electrode units, the border unit and the cutting unit further comprise a contact layer on a back side of the metal substrate.

9. The tape substrate of claim 8, wherein the contact layer comprises a second seed layer on the back side of the metal substrate and a second finish layer on the second seed layer.

10. The tape substrate of claim 9, wherein the second seed layer comprises nickel and the second finish layer comprises gold.

11. The tape substrate of claim 4, wherein the metal substrate comprises copper or a copper alloy.

12. The tape substrate of claim 1, wherein the at least one tape unit comprises a plurality of tape units and wherein the plurality of tape units are connected in the form of a reel.

13. The tape substrate of claim 1, wherein the pin electrode units are separated from each other by at least one trench.

14. A semiconductor module for a smart card, the semiconductor module comprising:
a tape substrate;
a semiconductor chip on the tape substrate; and
a plurality of wires connecting the semiconductor chip to the tape substrate,
wherein the tape substrate comprises at least one tape unit,
wherein the at least one the tape unit comprises:
a chip mounting unit on which the semiconductor chip is mounted;
a plurality of pin electrode units disposed adjacent to the chip mounting unit and separated from one another, wherein the wires are connected to the pin electrode units;
a border unit disposed around the chip mounting unit and the pin electrode units; and
a cutting unit disposed between the chip mounting unit and the border unit and between the pin electrode units and the border unit, wherein the cutting unit comprises a plurality of connection lines connecting the chip mounting unit and the pin electrode units to the border unit.

15. The semiconductor module of claim 13, wherein each of the pin electrode units further comprises:
a groove in a front side of a metal substrate; and
a bonding pad layer in the groove, and
wherein at least one of the wires is connected to the bonding pad layer.

16. The semiconductor module of claim 13, further comprising a molding unit formed on the tape substrate to cover the semiconductor chip and the wires.

17. The semiconductor module of claim 15, wherein the molding unit comprises an epoxy molding compound.

18. The semiconductor module of claim 14, further comprising a contact layer disposed on a back side of the metal substrate.

19. The semiconductor module of claim 18, wherein the bonding pad layer comprises a first seed layer and a first finish layer and wherein the contact layer comprises a second seed layer and a second finish layer.

20. The semiconductor module of claim 19, wherein the first and second seed layers comprise nickel and wherein the first and second finish layers comprise gold.

21. A tape substrate, comprising:
    a plurality of tape units arranged in a matrix, each of the tape units including:
        a chip mounting unit;
        a plurality of pin electrode units disposed adjacent to a portion of the chip mounting unit;
        a border unit disposed around the chip mounting unit and the pin electrode units; and
        a cutting unit disposed between the chip mounting unit and the border unit and between the pin electrode units and the border unit, wherein the cutting unit comprises a plurality of connection lines connecting the chip mounting unit and the pin electrode units to the border unit and wherein the connection lines are defined by a plurality of stamping holes; and
    a plurality of location holes disposed along at least one edge of the tape substrate.

* * * * *